(12) United States Patent
Saito

(10) Patent No.: US 6,377,385 B1
(45) Date of Patent: Apr. 23, 2002

(54) OPTICAL MODULE AND OPTICAL ELEMENT CONFIGURING THE OPTICAL MODULE

(75) Inventor: Takeshi Saito, Tokyo (JP)

(73) Assignee: Mitsubishi Denki Kabushiki Kaisha, Toyko (JP)

(*) Notice: Subject to any disclaimer, the term of this patent is extended or adjusted under 35 U.S.C. 154(b) by 0 days.

(21) Appl. No.: 09/709,460

(22) Filed: Nov. 13, 2000

(30) Foreign Application Priority Data

Jul. 13, 2000 (JP) ........................................ 2000-213251

(51) Int. Cl.[7] ............................... G02F 1/03; G02B 6/40
(52) U.S. Cl. ........................... 359/248; 385/54; 385/88; 385/90; 385/91; 385/92
(58) Field of Search ............................... 385/54, 88, 90, 385/92, 91, 49, 89, 93, 94, 14; 359/248

(56) References Cited

U.S. PATENT DOCUMENTS 6,058,234 A * 5/2000 Tachigori ...................... 385/49

FOREIGN PATENT DOCUMENTS

JP 11-26783 1/1999

OTHER PUBLICATIONS

Collins et al., "Passive Alignment Of A Tapered Laser With More Than 50% Coupling Efficiency", Electronics Letters, vol. 31, No. 9, Apr. 27, 1995, pp. 730–731.

* cited by examiner

*Primary Examiner*—Georgia Epps
*Assistant Examiner*—Tuyen Tra
(74) *Attorney, Agent, or Firm*—Leydig, Voit, & Mayer, Ltd.

(57) ABSTRACT

An optical module includes an optical element and a substrate firmly connected to each other, wherein the optical element includes metal marks for positional alignment with the substrate, and the substrate includes a V-shape groove as an optical member mounting section and etching marks for alignment with the optical element, wherein the etching marks are formed using the same mask used for forming the optical member mounting section, so that a dispersion in the coupling efficiency among individual modules can be suppressed, improving the yield of the manufactured optical modules.

7 Claims, 9 Drawing Sheets

OPTICAL MODULE AND OPTICAL ELEMENT CONFIGURING THE OPTICAL MODULE

BACKGROUND OF THE INVENTION

1. Field of the Invention

The present invention relates to an optical module for use in transmitting and receiving optical signals in an optical system, and also relates to an optical element of the optical module.

2. Description of the Related Art

FIG. 16 is a sectional view showing the configuration of a conventional optical module as disclosed in the Patent Application Laid-Open No. 11-26783. In the figure, reference numeral 101 denotes an optical fiber, 102 denotes a light detecting element for detecting the total reflected light reflected by the tip end of the optical fiber, which end is cut in an oblique manner, and carrying out a light-to-electricity conversion, 103 denotes a step-form stopper for setting the position of the optical fiber 101 by abutting it against the tip end portion of the optical fiber, and 104 denotes an optical fiber suppressor.

FIG. 17 is a plan view showing a silicon substrate of the conventional optical module. In the figure, reference numeral 105 denotes a silicon substrate, 106 denotes a guide groove for fixing the optical fiber therein, 107 denote a pair of substrate-side alignment patterns disposed symmetrically the guide groove 106, each pattern being part of a metalized pattern, and numeral 108 denote AuSn solder for fixing the light detecting element 102 to the silicon substrate in the final process.

FIG. 18 is a plan view showing the front surface and the rear surface of the light detecting element 102 of the above-explained optical module. In the figure, reference numeral 109 denotes an electrode formed on the front surface side, 110 denotes an incident-light incident window formed in the rear surface side for receiving the incident signal light, 111 denotes a light incident surface, and numeral 112 denote a pair of light detecting element side alignment patterns disposed symmetrically about the light receiving surface 111, each being formed as a part of a metalized pattern.

Next, the operation for firmly connecting the light detecting element to the silicon substrate in the conventional optical module is explained.

FIG. 19 is an illustration showing the configuration of a visual alignment execution system for firmly connecting the light detecting element to the silicon substrate. In the figure, reference numeral 113 denotes an arm for holding the light detecting element 102 and adjusting the position thereof, numeral 114 denotes infrared rays upwardly irradiated from the lower side thereof, numeral 115 denotes a camera for taking photographs by use of the infrared rays, and 116 denotes a heater for heating and melting the solder when the desired relative positions between the optical element and the silicon substrate are obtained. During the positional adjustment process, the position of the light detecting element 102 is first adjusted by driving the arm 113, and thereafter the arm is fixed when the center of each of the alignment patterns 107 of the silicon substrate 105 and that of each of the alignment patterns 112 of the light detecting element 102 are aligned. After these operations, the heater 116 is heated to melt the AuSn solder 108 provided on the silicon substrate 105, so as to firmly attach the light detecting element 102 to the silicon substrate 105.

It should be noted that the above conventional technique has been explained as to the case in which a light detecting element is employed as the optical element. However, the same positional adjustment process is used as well for firmly attaching a laser diode (hereinafter may be referred to just as an "LD"), an optical waveguide and so on to the silicon substrate.

Since the conventional optical module is constructed as explained above, the operating section of the optical element side provided as the light incident surface of a light detecting element, the light emitting point of a laser diode and so on are formed by a different process from the process for forming the optical-element-side alignment patterns, each provided as a metal mark by use of different masks. On the other hand, the V-shape guide groove in which a unidirectional optical fiber is to be mounted and the substrate-side alignment patterns each provided as a metal mark are processed also differently by using different masks. Due to these different processes by use of different masks, there has been produced a discrepancy of several micrometers therebetween, so that no matter how precisely the optical element, the optical fiber and so on are mounted, there has been caused a discrepancy between the operating section of the optical element side such as the light incident surface, and the light emitting point and the core of the optical fiber, which should essentially be matched precisely, so that a dispersion in the coupling efficiency among each of the optical modules has been caused, thereby to lowering the yield of the thus manufactured optical modules as a whole.

SUMMARY OF THE INVENTION

The present invention has been proposed to solve the problems aforementioned, and it is an object of the present invention to provide an optical module capable of improving the coupling efficiency between an optical element and a substrate for receiving the optical element by raising the precision in the relative positional alignments and thereby raising the yield of the optical modules as a whole, and also an optical element as an important element configuring the optical module.

In order to achieve the above objects, the optical module according to a first aspect of the present invention is composed essentially of an optical element and a substrate firmly connected to each other, wherein the optical element is formed with one or more than one metal marks for the positional alignment with the substrate, and the substrate is formed with an optical member mounting section and one or more than one etching marks for alignment with the optical element, the recessed etched marks being formed by a process in which the same mask as that used for forming the optical member mounting section is used.

In this configuration, the metal masks are formed in a protruded manner form the surface of the optical element, and the recessed etched marks are formed in a receding manner from the surface of the substrate.

The optical module according to another aspect of the present invention is composed of an optical element and a substrate firmly connected to each other, wherein the optical element is formed with an operating section, an optical-element-side electrode and one or more than one guide sections for the positional alignment with the substrate, and the substrate is formed with an optical member mounting section and one or more than one etching marks for alignment with the optical element, wherein the guide sections are formed by a process in which the same mask as that used for forming the operating section is used, and the recessed etched marks are formed by a process in which the same mask as that used for forming the optical member mounting section is used.

In the above construction, the optical element further comprises position sensing metals each provided on the lateral end portion of the optical element, each of the position sensing metals having a position sensing section whose position is adjusted by the guide section.

The optical module according to another aspect of the present invention is configured in such a manner that the substrate is formed with a recess for accommodating a substrate-side electrode and solder mounted on the electrode, wherein the optical-element-side electrode is not brought into contact with the substrate even when the optical element is disposed at the connecting position to the substrate, and the position sensing metals are abutted against the surface of the substrate formed with a plurality of etching marks.

The optical module according to another aspect of the present invention is configured in such a manner that the substrate is formed with a recess for accommodating a substrate-side electrode and solder mounted on the electrode, wherein the optical-element-side electrode is not brought into contact with the substrate even when the optical element is disposed at the connecting position to the substrate, and the position guide sections are abutted against the surface of the substrate formed with a plurality of recessed etched marks.

The optical element according to still further aspect of the present invention is constructed such that it comprises an operating section and one or more than one guide sections for the positional alignment with a substrate to which the optical element is to be firmly connected, wherein the guide sections are formed by a process in which the same mask as that used for forming the operating section is used.

The optical element as constructed above according to yet still further aspect of the present invention further comprises one or more than one position sensing metals each provided on the lateral end portion of the optical element, each of the position sensing metals having a position sensing section whose position is adjusted by the guide section.

DETAILED DESCRIPTION OF THE PREFERRED EMBODIMENTS

Several embodiments of the present invention are now explained below.

(First Embodiment)

Figure 1:
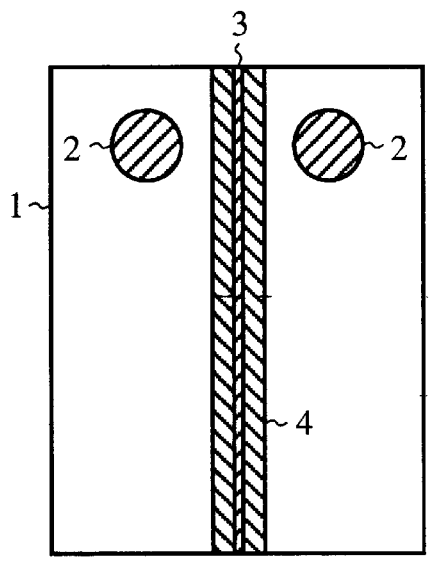
FIG. 1 is a plan view showing a laser diode (LD) as an optical element of an optical module according to a first embodiment of the present.

FIG. 1 is a plan view showing a laser diode (LD) as an optical element configuring an optical module according to a first embodiment of the present. In the figure, reference numeral 1 denotes a main body of the LD (optical element), 2 denotes a pair of metal marks for use in the alignment operation (hereinafter may be referred to just as "alignment-use metal marks) mounted on the laser diode in a protruded manner, 3 denotes an active layer (operating section), and 4 denotes an electrode (optical-element-side electrode). It should be noted that although the active layer 3 is disclosed as if it can be observed as shown in FIG. 1, in fact, it cannot be seen from this angle as it is under the surface of the main body 1, and note that this description is just for informing its positional relation in the horizontal direction with respect to the electrode 4.

Figure 2:
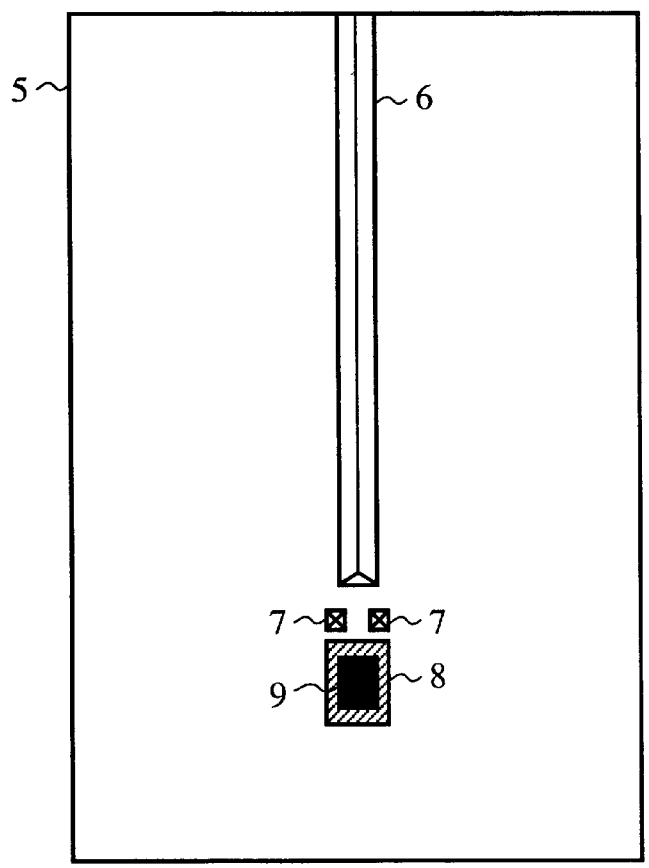
FIG. 2 is a plan view showing a silicon (Si) substrate of the optical module according to the first embodiment of the present invention.

FIG. 2 is a plan view showing a silicon (Si) substrate configuring the optical module of the first embodiment. In the figure, reference numeral 5 denotes the main body of the Si substrate (substrate), 6 denotes a V-shape guide groove for mounting an optical fiber therein formed in the Si substrate (an optical member mounting section), 7 denote a pair of recessed etched marks formed by an etching operation using the same mask as that used for forming the V-shape guide groove, which recessed etched being formed at the same time with the V-shape groove, 8 denotes an electrode (plate-side electrode), and 9 denotes a solder. It should be noted that since the V-shape groove 6 and the recessed etched marks 7 are formed at the same time by the same etching processes using the same mask, the distance between the center of the V-shape groove 6 and that of the recessed etched marks 7 can be managed to be suppressed to ±0.2 μm or less than that.

Figure 3:
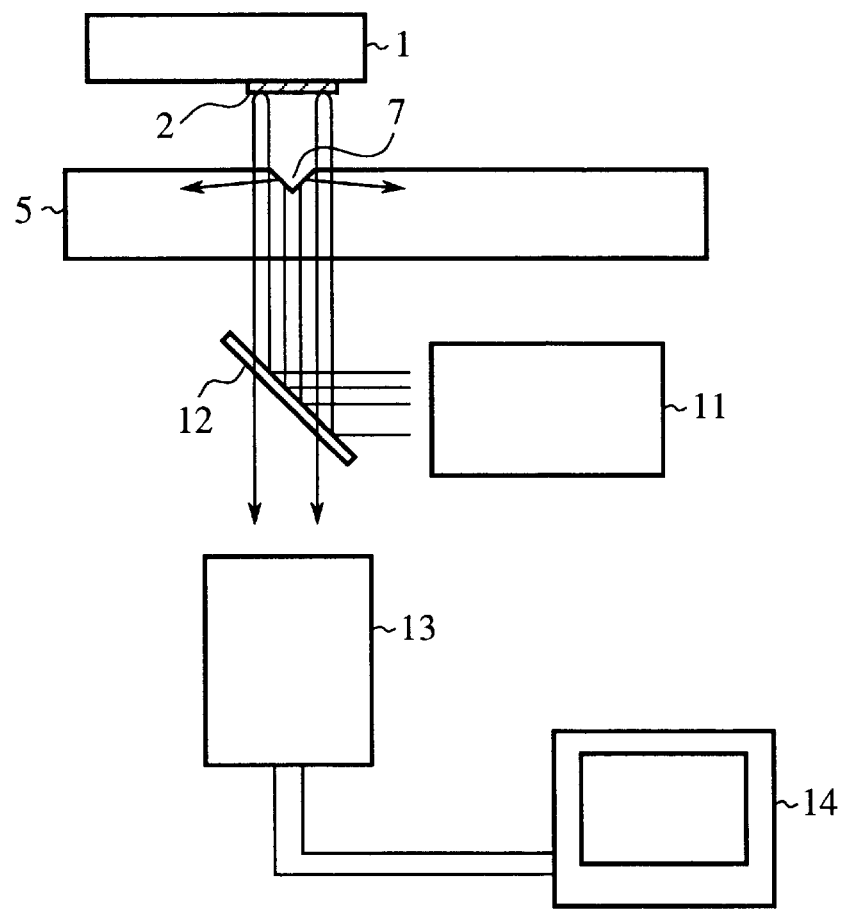
FIG. 3 is an illustration showing the configuration of an alignment system using infrared rays for an optical element and a silicon (Si) substrate.

FIG. 3 is an illustration showing the configuration of an alignment system using infrared rays for aligning the optical element with the Si substrate. In the figure, since the same reference numbers used in FIGS. 1 and 2 indicate same or similar portions, the detailed explanation thereabout is omitted here. In FIG. 3, reference numeral 11 denotes a light emitting source for emitting infrared rays, 12 denotes a semi-translucent mirror, 13 denotes an infrared-ray camera for photographing by use of the infrared rays, and numeral 14 denotes a monitor for displaying an image photographed by the infrared-ray camera 13.

Next, positional adjustment of the LD and the Si substrate using the above-explained alignment system is explained as below.

As shown in FIG. 3, the infrared rays emitted from the light emitting source 11 are reflected on the semi-translucent mirror 12 and incident on the rear surface of the Si substrate 5. As for the Si substrate 5, it is preferable to be coated with a reflection preventing layer on both the front and rear surfaces thereof, so as to raise the transmissivity of the infrared rays.

Thereafter, the infrared rays incident on and transmitted through the rear surface of the Si substrate 5 are externally irradiated from the front surface of the Si substrate 5. It should be noted, however, that the infrared rays are reflected and refracted at the front surface portion of the Si substrate 5 in the region where the recessed etched marks 7 are formed.

Thereafter, the infrared rays transmitted through the front surface of the Si substrate 5 are irradiated to the LD 1, although they are reflected in the region where the metal marks 2 are formed. These reflected rays advance in the reverse direction of the optical path in which they had straightly advanced from the semi-translucent mirror 12 before, transmit through the semi-translucent mirror, and are detected by the infrared-ray camera 13 to be displayed on the monitor 14 as bright portions.

Figure 4:
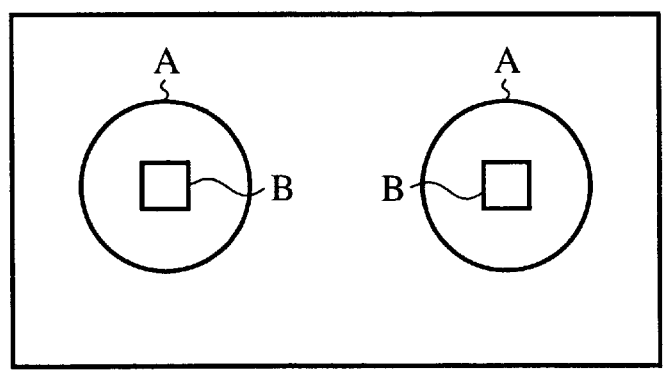
FIG. 4 is an illustration showing an image photographed and displayed by the alignment system using infrared rays.
Figure 5:
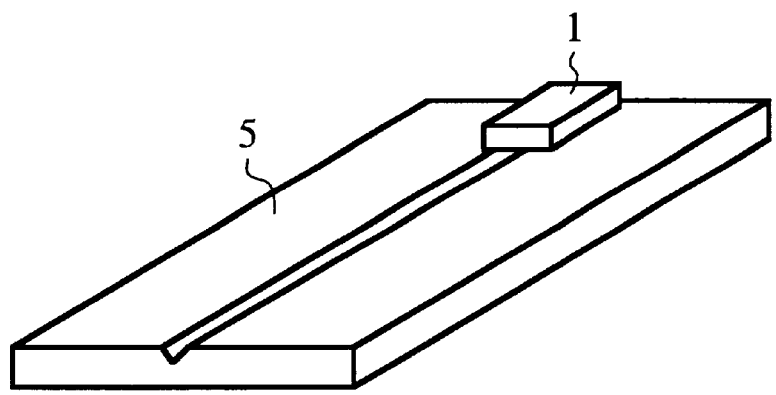
FIG. 5 is an illustration showing the configuration of the optical module composed by the optical element and the silicon substrate.

FIG. 4 is an illustration showing an image photographed and displayed by the alignment system using infrared rays. In the figure, the portion represented by the reference character A (hereinafter referred to just as "area A") shows an area where the infrared rays are reflected by the metal marks 2, whereas the portion represented by the reference character B (hereinafter referred to just as "area B") shows an area where the infrared rays are reflected and refracted by the recessed etched marks 7. When the metal marks 2 and the recessed etched marks 7 are overlapped each other, the area B is shown as a dark portion within the area A. For this reason, positional adjustment of the LD 1 and the Si substrate 5 is made possible by carrying out an image processing through calculation of the center of gravity or the like about each of the areas A and B. After completion of the positional adjustment of these LD 1 and the Si substrate 5, these are firmly connected to each other by raising temperature to a level in which solder is melted. FIG. 5 is an illustration showing the configuration of the optical module thus composed by the LD 1 and the Si substrate 5 in accordance with these processes.

As explained hereinabove, the optical module according to the first embodiment of the present invention is configured by the optical element 1 on which the alignment-use metal marks are provided, and the Si substrate 5 provided with recessed etched marks which are formed by an etching process using the same mask as that used for forming the V-shape groove 6 for mounting an optical fiber therein. Due to this construction, since the positional discrepancy between the V-shape groove 6 formed in the Si substrate 5 and the recessed etched marks 7 formed on the same Si substrate 5 can be reduced to approximately ±0.2 μm, the optical module constructed on the basis of the alignment of the positions of the metal marks and the recessed etched marks by use of infrared rays can cause such an effect that the positional discrepancy between the position of an optical member such as an optical fiber mounted in the V-shape groove 6 formed in the Si substrate 5 and the center of the active layer 3 provided as an operating section of the LD 1 can be reduced, preventing thereby a dispersion in the coupling efficiency of individual modules, and thus improving the yield of the manufactured optical modules as a whole.

(Second Embodiment)

Figure 6:
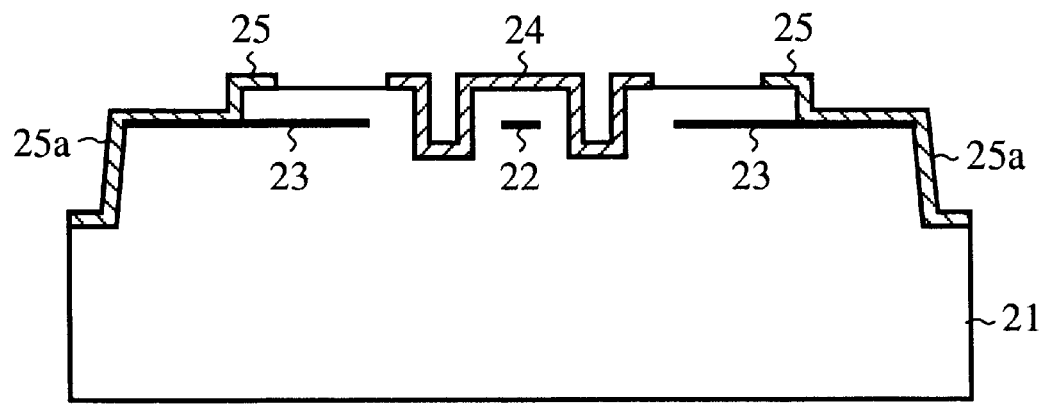
FIG. 6 is a sectional view showing a laser diode provided as an optical element of the optical module according to a second embodiment of the present invention.

FIG. 6 is a sectional view showing an LD provided as an optical element configuring the optical module according to a second embodiment of the present invention. In the figure, reference numeral 21 denotes a main body of the LD (optical element), 22 denotes an active layer (operating section) formed by applying a crystal growth to a compound semiconductor, 23 denote alignment guide sections each formed simultaneously with the corresponding active layer 22 by a process in which the same mask as that used for forming the active layer 22 is used, 24 denotes an electrode (optical-element-side electrode), 25 denote position sensing metals each formed by a mold layer provided on the upper surface and the like of the guide section 23, and numeral 25a denote slant surfaces each provided for positioning the corresponding position sensing metal 25 by use of the edge portion of the guide section 23.

Figure 7:
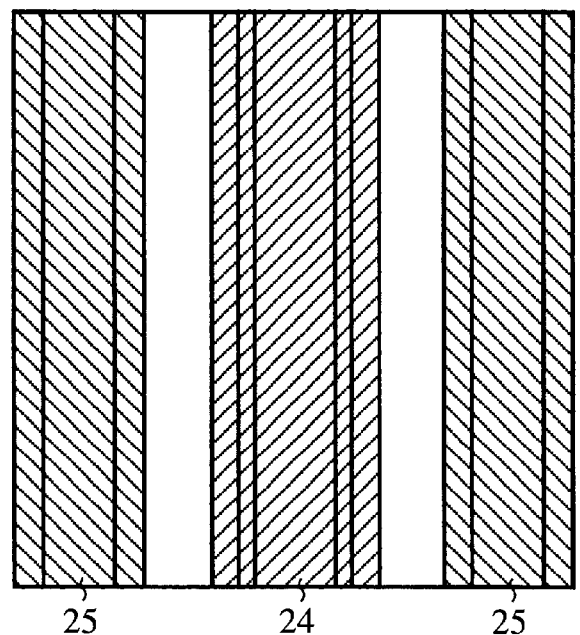
FIG. 7 is a plan view showing a laser diode provided as an optical element of an optical module according to the second embodiment of the invention.

FIG. 7 is a plan view showing an LD provided as an optical element configuring an optical module according to the second embodiment of the present. In the figure, since the same reference numerals as those shown in FIG. 6 indicate the same or similar portions, the detailed explanation thereabout is omitted here.

Figure 8:
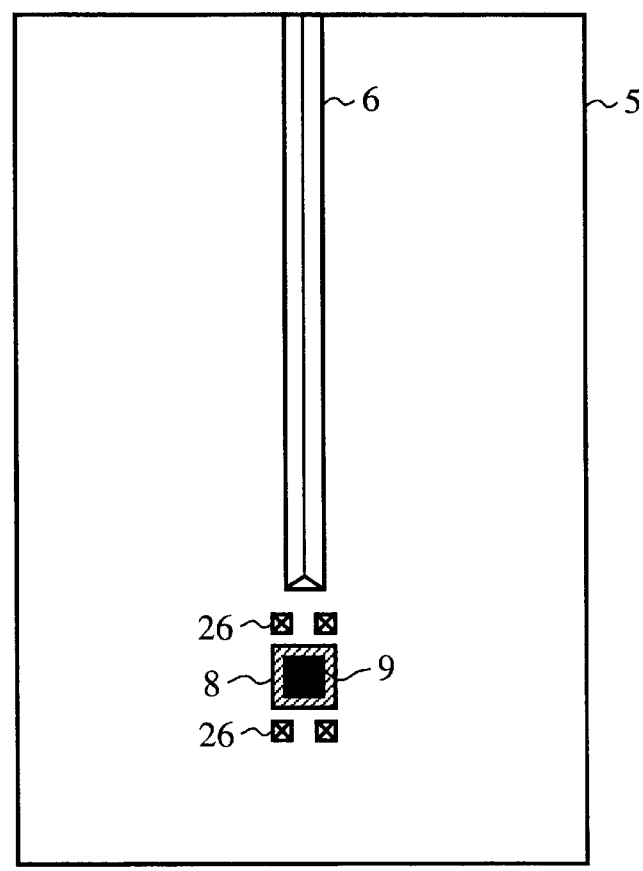
FIG. 8 is a plan view showing a silicon substrate of the optical module according to the second embodiment of the present invention.

FIG. 8 is a plan view showing an Si substrate configuring the optical module according to the second embodiment of the present. invention. In the figure, since the same reference numerals as those used in FIG. 2 indicate same or similar portions, the detailed explanation thereabout is omitted here. Reference numeral 26 denote etching marks formed by an recessed etched process using the same mask as that used for forming the V-shape guide groove 6, which recessed etched marks being formed at the same time with the V-shape groove. Although plural numbers of etching marks 26 can be formed, only 4 recessed etched marks 26 are provided in this second embodiment. Note that the configuration of the LDs shown in FIGS. 6 and 7 is based on the configuration as shown in page 730 of "Electronics Letters Vol. 31 No.9 (1995).

By configuring the LDs as explained above, the active layer 22 provided as a light source and the guide sections 23 are formed by use of the same mask, the distance between the center of the active layer 22 and the edge portion of each of the guide sections 23 can be made to ±0.2 μm or less than that. Further, as the position of each of the slant surfaces 25a is determined by an edge portion of the corresponding guide section 23, the distance between the center of the active layer 22 and each of the slant surfaces 25a can also be made to the same precision.

Next, the positional adjustment of the LD and the Si substrate is explained below.

The infrared alignment system for use in this positional adjustment is same as the system shown in FIG. 3, and thus no explanation thereabout is provided here. As to the electrode 8 provided on the Si substrate 5, the electrode 24, and the position sensing metals 25 provided on the LD 21, they are displayed on the monitor 14 as bright portions when the infrared rays reflected thereon are detected by the infrared camera 13. However, since the infrared rays incident on the slant surface 25a of the position sensing metals 25 are refracted and reflected, they are not detected by the infrared camera. Further, just as the first embodiment, the infrared rays incident on the recessed etched marks 26 are not detected by the infrared camera 13 either.

Figure 9:
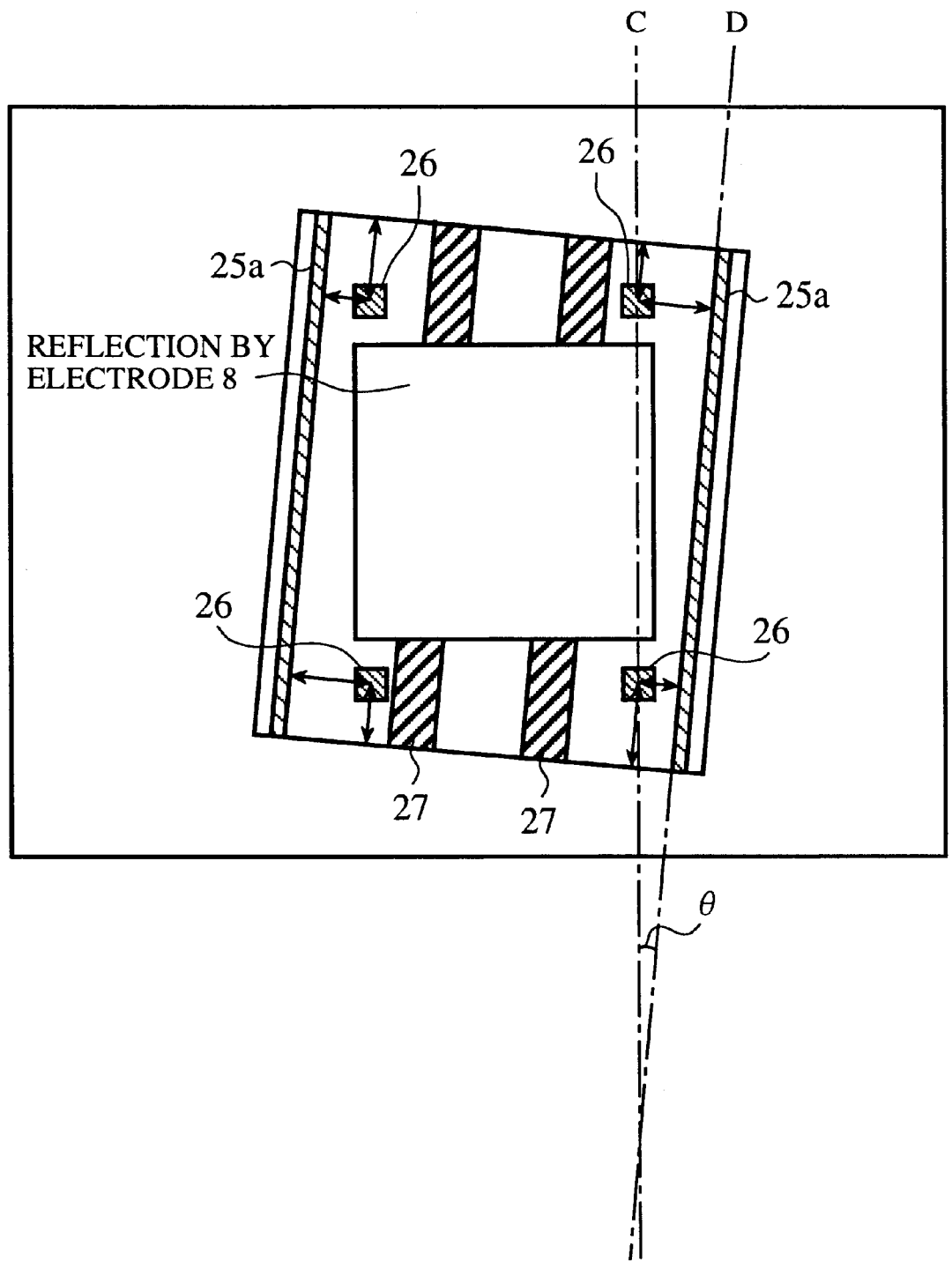
FIG. 9 is an illustration showing one example of an image photographed and displayed by the alignment system using infrared rays for the purpose of adjusting relative positions between the laser diode and the silicon substrate.

FIG. 9 is an illustration showing one example of an image photographed and displayed by the infrared alignment system in adjusting the relative positions between the LD and the Si substrate according to the second embodiment of the present invention. The area displayed as a dark portion by the monitor 14 are disclosed by hatching technique. As explained above, the band-shape area of the slant surface 25a and the square areas of the recessed etched marks 26 are displayed as dark portions, and the area between the position sensing metals 25 and the electrode 24 defined by reference numeral 27 in which no metal is provided is also displayed as a dark portion.

For adjusting the positions by the thus obtained image as shown in FIG. 9, it should be arranged such that the distance between the center portion of each of the etching marks 26 and the corresponding slant surfaces 25a is made to a predetermined distance in order to adjust in the leftward and rightward directions. Further, it should be arranged such that the distance between the center portion of each of the recessed etched marks 26 and either the front surface or the rear surface of the LD 21 is made to a predetermined distance, in order to adjust in the direction of the optical axis.

Still further, the angle θ made by the chain line C connecting two recessed etched marks 26 and the other chain line D indicating the slant surface 25a can be adjusted to a desired angle by carrying out an image processing. Or otherwise, the angle θ can be adjusted to a desired degree of angle also by first setting the distances between each of the 4 recessed etched marks 26 provided on the Si substrate 5 and each of the slant surfaces 25a, and thereafter adjusting it on the basis of the thus set distances. When the above positional adjustment process is terminated, the temperature is raised to such a level that the solder is melted, so as to firmly connect the Si substrate and the LD. FIG. 5 is an illustration showing the configuration of the optical module thus composed by the above-explained process.

As explained hereinabove, the optical module according to this second embodiment is constructed by an LD 21, which is formed with the alignment-use guide sections 23 formed simultaneously with the operating section 22 by a process in which the same mask as that used for forming the operating section such as the active layer 22 is used, and the slant surfaces 25a each provided as the position sensing section whose position is adjusted by the corresponding guide section 23, and an Si substrate 5 on which recessed etched marks 26 are formed simultaneously with the V-shape groove 26 by the etching process in which the same mask as that used for forming the V-shape groove 26 is used.

Since it is constructed as above, the same effect as that obtained by the first embodiment can be obtained, and the positional discrepancy between the active layer 22 as the light emitting source and the slant surface 25a provided on the LD 21 can be reduced to such an extent of ±0.2 μm, so that as to the optical module manufactured by the firm attachment of the Si substrate 5 and the LD 21 based on the relative positions between the recessed etched marks 26 formed in the Si substrate 5 and the slant surface 25a formed in the LD 21 by use of the infrared rays, the positional discrepancy between the optical member mounted in the V-shape groove 6 formed in the Si substrate 5 and the center portion of the active layer 22 as an operating section of the LD 21 can also be reduced, preventing thereby a dispersion in the coupling efficiency among each of the optical modules, and thus improving the yield of the manufactured optical modules as a whole.

It should be noted that the above second embodiment has been explained as to the case in which each of the slant surfaces 25 is provided as a position sensing section by adjusting the position of the corresponding slant surface 25a of the position sensing metals 25 by use of the edge of the corresponding guide section 23 formed by the same process in which the active layer 22 is formed by use of the same mask. However, each of the flat portion of the position sensing metals 25 can be provided as the position sensing section by adjusting the position of each of the flat portions of the position sensing metals 25 by use of the edge portions of the corresponding guide sections 23.

Figure 10:
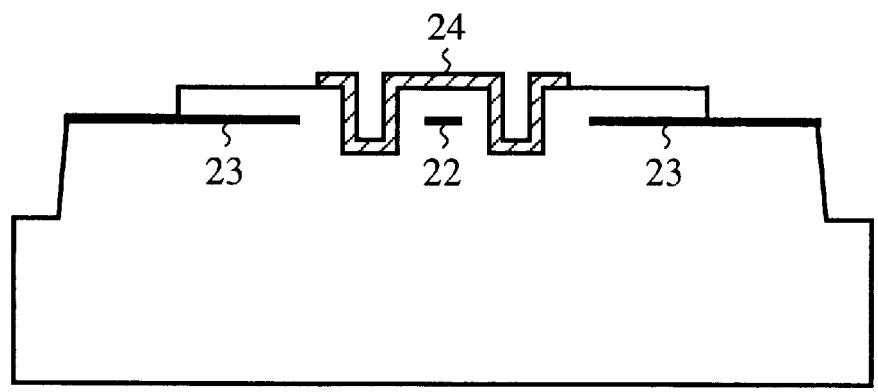
FIG. 10 is a sectional view showing a modified example of the laser diode of the optical module of the second embodiment of the present invention.
Figure 11:
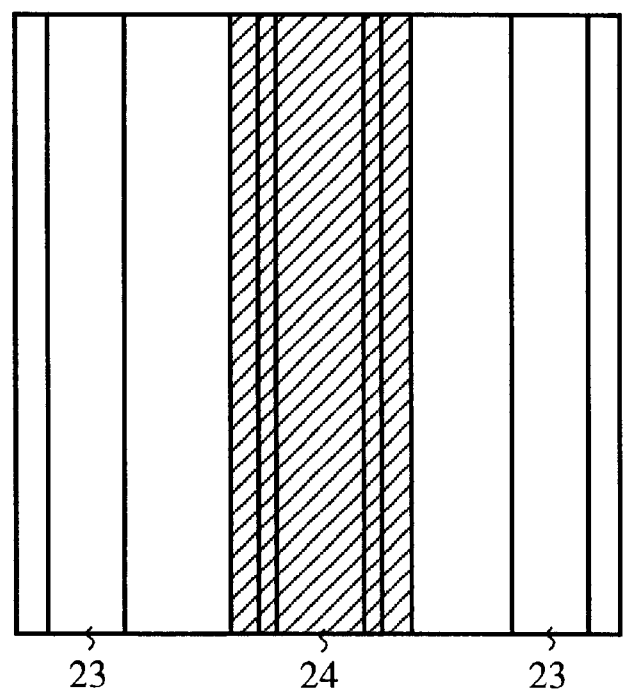
FIG. 11 is plan showing a modified example of the laser diode of the optical module of the second embodiment of the present invention.

FIG. 10 is a sectional view showing a modified example of the LD configuring the optical module of the second embodiment of the present invention, whereas FIG. 11 is a plan view of the thus modified example. The LD according to this modified example is different from the one shown in FIG. 6 or the like in that there is no position sensing metal provided therein.

The guide sections 23 also reflect infrared rays, although it is much fewer in comparison with the amount reflected on the position sensing metals 25, and due to this, recognition of images is quite difficult. However, the recessed etched marks 26 displayed as dark portions within the lights reflected by the guide sections 23 can be observed by adjusting the amount of the irradiated infrared rays and the position of the camera and so on. Further, since the process for providing a metal layer concerning the position sensing metal can be omitted, the process for providing an LD chip can be simplified, reducing thereby the total costs.

(Third Embodiment)

Figure 12:
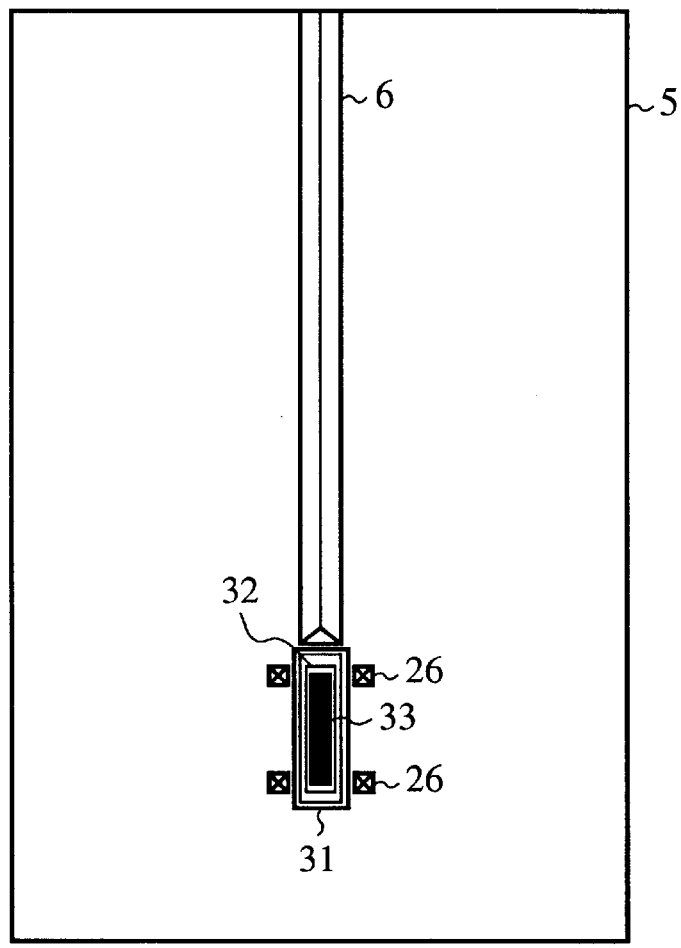
FIG. 12 is a plan view showing a silicon substrate of the optical module according to a third embodiment of the present invention.
Figure 13:
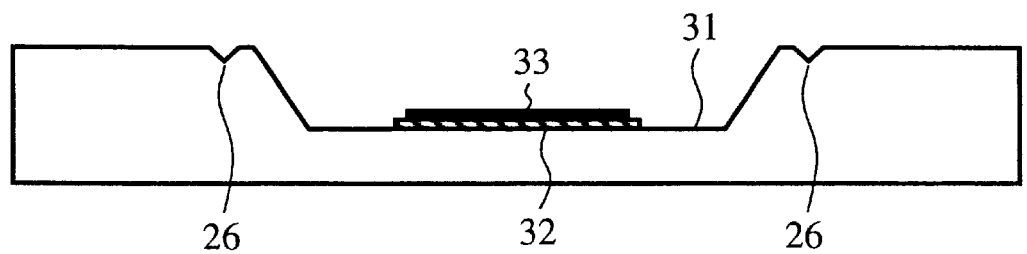
FIG. 13 is a sectional view showing a silicon substrate of the optical module according to the third embodiment of the present invention.

FIG. 12 is a plan view showing an Si substrate configuring the optical module according to a third embodiment, whereas FIG. 13 is a sectional view showing an Si substrate configuring the optical module according to the third embodiment of this invention. In these figures, since the same reference numerals as those shown in FIG. 8 indicate the same or similar portions, the detailed explanation thereabout is omitted here. Reference numeral 31 denotes a recess formed in the Si substrate 5 with a predetermined distance from the groove 6 in the direction in which the groove 6 extends, numeral 32 denotes an electrode (substrate-side electrode) provided within the recess 31, and numeral 33 denotes a solder mounted on the electrode 32. Note that the recess 31 is formed having such a width and a depth by which the electrode (optical-element-side electrode) 24 and the Si substrate 5 do not contact with each other when the LD 21 shown in FIG. 6 is disposed on the connecting position thereof with respect to the Si substrate 5.

Figure 14:
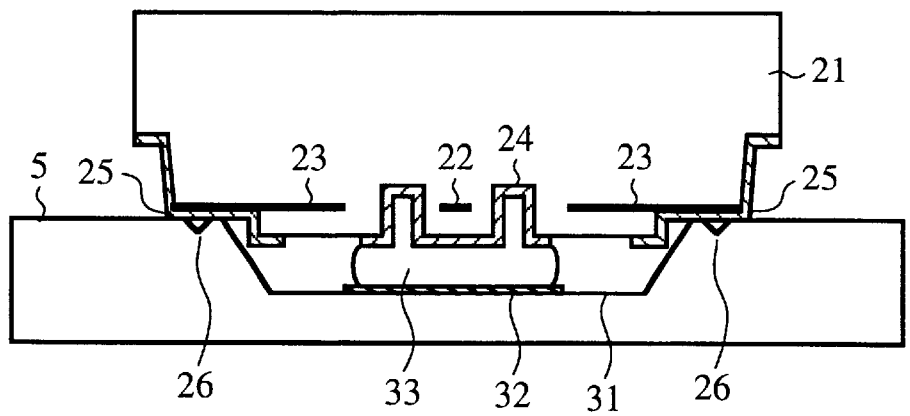
FIG. 14 is a sectional view showing the configuration of the optical module according to the third embodiment of the present invention.

FIG. 14 is a sectional view showing the configuration of the optical module according to the third embodiment of the present invention. When attaching the LD 21 to the Si substrate 5, as shown in FIG. 14, the recessed etched marks 26 formed in the Si substrate 5 are abutted against the position sensing metals 25 of the LD 21, and thereafter raising the temperature to the level at which the solder is melted, the electrode 24 of the LD 21 and the electrode 32 of the Si substrate 5 are firmly connected by the thus melted solder 33. The thickness of the position sensing metals 25 formed in the LD 21 is approximately 1 µm, and the tolerance thereof is ±20%, so that the positional discrepancy of the LD 21 with respect to the Si substrate 5 in the vertical direction is approximately ±0.2 µm. Note that the configuration of the optical module composed on the basis of the above-explained process will be just as the one shown in FIG. 5.

As explained hereinabove, according to the third embodiment, the same effect as that obtained by the second embodiment can be obtained. Besides, the Si substrate 5 is formed with a recess 31 in which the electrode 32 and the solder 33 are accommodated, and even when the LD 21 is disposed in its connecting position to the Si substrate 5, the electrode 24 of the LD 21 and the Si substrate 5 do not contact with each other, whereas the position sensing metals 25 are brought into contact with the surface of the Si substrate 5 formed with the etching marks 26. Due to this construction, the positional discrepancy in the vertical direction possibly caused by the change in the thickness of the solder in its melted state for connecting the electrode 32 of the Si substrate 5 and the electrode 24 of the LD 21 can be eliminated, and thus, the positional discrepancy in the vertical direction regarding the position of the LD 21 with respect to the Si substrate 5 is reduced to approximately ±0.2 µm on the basis of the tolerance of the thickness of the position sensing metal, so that a dispersion in the coupling efficiency among individual modules can be suppressed, and thus improving the yield of the manufactured optical modules as a whole.

(Fourth Embodiment)

Figure 15:
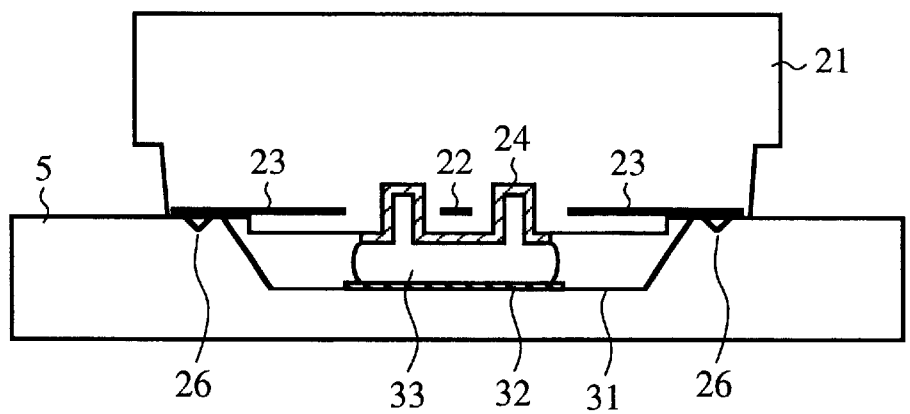
FIG. 15 is a sectional view showing the configuration of the optical module according to a fourth embodiment of the present invention.
Figure 16:
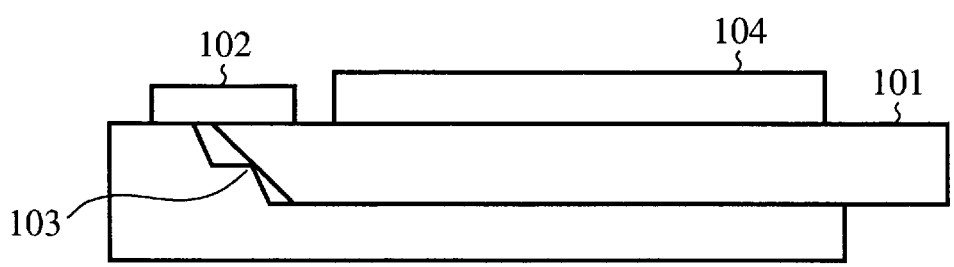
FIG. 16 is a sectional view showing the configuration of a conventional optical module.
Figure 17:
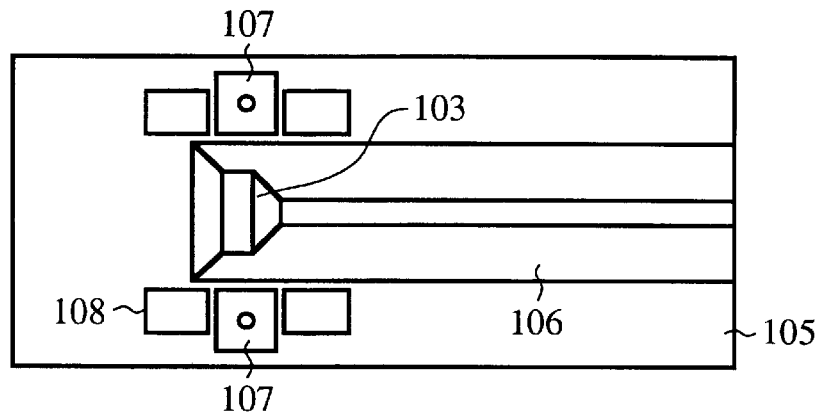
FIG. 17 is a plan view showing the silicon plate of the conventional optical module.
Figure 18:
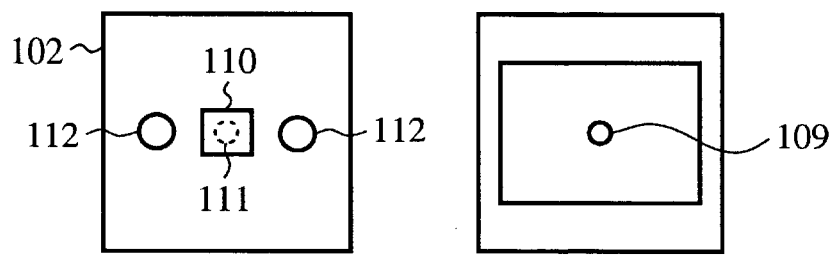
FIG. 18 is a plan view showing the light detecting element configuring the conventional optical module.
Figure 19:
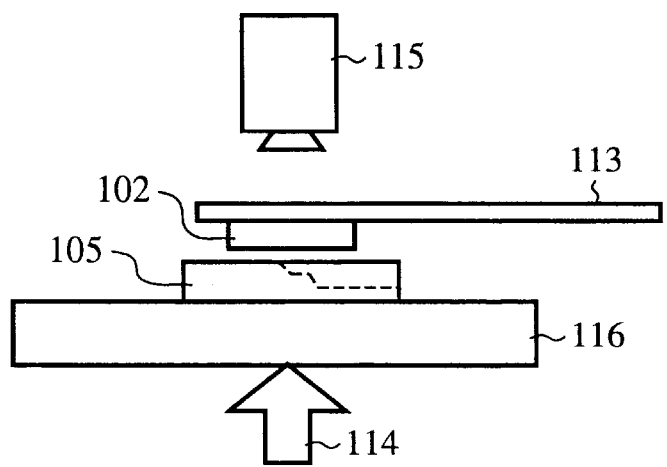
FIG. 19 is an illustration showing the configuration of a visual alignment execution system.

FIG. 15 is a sectional view showing the configuration of the optical module according to a fourth embodiment of this invention. The optical module according to this embodiment is different from that of the third embodiment in which the LD 21 is not provided with the position sensing metals 25. In other words, in the third embodiment, the LD of the optical module of the second embodiment is used, whereas in the fourth embodiment, the LD of the optical module according to a modified example of the second embodiment is used.

As shown in FIG. 15, when the LD 21 is disposed in its connecting position, the guide sections 23 are brought into contact with the surface of the Si substrate 5 formed with the recessed etched marks 26. Due to this, since the position sensing metals 25 which exist in the third embodiment do not exist, the positional discrepancy in the vertical direction can be greatly reduced.

As explained hereinabove, according to the fourth embodiment, the same effect as that obtained by the second embodiment can be obtained. Besides, the Si substrate 5 is formed with a recess 31 in which the electrode 32 and the solder 33 are accommodated, and even when the LD 21 is disposed in its connecting position to the Si substrate 5, the electrode 24 of the LD 21 and the Si substrate 5 do not contact with each other, whereas the guide sections 23 are brought into contact with the surface of the Si substrate 5 formed with the recessed etched marks 26. Due to this construction, the positional discrepancy in the vertical direction possibly caused by the change in the thickness of the solder in its melted state for connecting the electrode 32 of the Si substrate 5 and the electrode 24 of the LD 21 can be eliminated, and thus the positional discrepancy in the vertical direction can be greatly reduced, so that a dispersion in the coupling efficiency among individual modules can be suppressed, and thus improving the yield of the manufactured optical modules as a whole.

Note that all the first to fourth embodiments have been explained as to the case in which an LD is adopted as an optical element. However, the present invention should not be limited to this use, but can be applied even to other types of optical modules having an Si substrate and another type of an optical element such as a waveguide type Photo Diode, a light waveguide and so on.

As explained heretofore, an optical module according to the present invention comprises an optical element which is formed with metal marks therein for its positional alignment, and a substrate which is formed with recessed etched marks for its alignment with the optical element, wherein the recessed etched marks are formed by a process in which the same mask as that used for forming in the substrate an optical member mounting section is used.

Due to this construction, the positional discrepancy between the optical member mounting section and the recessed etched marks both formed in the substrate can be reduced, and thus in the optical module formed by a firm attachment based on the positional adjustment of the metal marks and the recessed etched marks by use of infrared rays, the positional discrepancy between an optical member mounted on the optical member mounting section formed in the substrate and the operating section of the optical element can be reduced, so that a dispersion of the coupling efficiency among each of the optical modules can be reduced, thereby to improve the yield of the manufactured optical modules as a whole.

Further, an optical module according to the present invention comprises an optical element which is formed with guide sections for its positional alignment, wherein each of the guide sections is formed by a process in which the same mask as that used for forming the operating section in the optical element is used, and a substrate which is formed with etching marks for its positional alignment with the optical element, wherein the recessed etched marks are formed by a process in which the same mask as that used for forming in the substrate an optical member mounting section is used.

Due to this construction, since the recessed etched marks displayed as dark portions within the infrared rays reflected by the guide sections can be recognized on a monitor device or the like, the positional adjustment between the substrate and the optical element is also made possible. In addition, since in the optical element a process for applying a metal layer for forming the metal section used for position sensing of the recessed etched marks can be omitted, the total process for producing an optical member can be simplified, thereby to reduce the total cost for all the components as a whole.

Further, an optical module according to the present invention is constructed in such a manner that the optical member is provided with position sensing metals each having a position sensing section whose position is adjusted by the corresponding guide section.

Due to this construction, since the positional discrepancy between the optical member mounting section and the etching marks both formed in the substrate can be reduced, the positional discrepancy between the operating section of the optical element and the position sensing sections of the position sensing metals can also be reduced, so that in the optical module formed by a firm attachment based on the positional adjustment of the position sensing section and the recessed etched marks by use of infrared rays, the positional discrepancy between the optical member mounted on the optical member mounting section formed in the substrate and the operating section of the optical element can be reduced, so that a dispersion in the coupling efficiency among each of the optical modules can be reduced, thereby to improve the yield of the manufactured optical modules as whole.

Further, an optical module according to the present invention is constructed such that the substrate is formed with a recess for accommodating a substrate-side electrode and solder mounted on the electrode, wherein the electrode is not brought into contact with the substrate when the optical element is disposed at the connecting position with respect to the substrate, and the position sensing metals are abutted against the surface of the substrate formed with a plurality of recessed etched marks.

Due to this construction, the positional discrepancy in the vertical direction possibly caused by the change in the thickness of the solder in its melted state for connecting the electrode of the substrate and the electrode of the optical element can be eliminated, and thus the positional discrepancy. regarding the position of the optical element with respect to the substrate can be reduced to an extent of the tolerance of the thickness of the position sensing metal, so that a dispersion in the coupling efficiency among individual modules can be suppressed, and thus improving the yield of the manufactured optical modules as a whole.

Further, an optical module according to the present invention is constructed such that the substrate is formed with a recess for accommodating a substrate-side electrode and solder mounted on the electrode, wherein the electrode is not brought into contact with the substrate when the optical element is disposed at the connecting position with respect to the substrate, and the guide sections are directly abutted against the surface of the substrate formed with a plurality of recessed etched marks.

Due to this construction, the positional discrepancy in the vertical direction possibly caused by the change in the thickness of the solder in its melted state for connecting the electrode of the substrate and the electrode of the optical element can be eliminated, and because there is no position sensing metals provided therein, the tolerance for the thickness can be made to "0", the positional discrepancy in the vertical direction regarding the position of the optical element with respect to the substrate can be greatly reduced, so that a dispersion in the coupling efficiency among individual modules can be suppressed, and thus improving the yield of the manufactured optical modules as a whole.

Still further, an optical element according to the present invention is constructed such that it comprises guide sections for its alignment with the substrate, wherein the guide sections are formed by a process in which the same mask as that used for forming an operating section of the optical element is used.

Due to this construction, the positional discrepancy between the operating section and the guide sections of the optical element can be reduced.

Yet still further, an optical element according to the present invention is constructed such that it further comprises position sensing metals each having a position sensing section whose position is adjusted by the corresponding guide section.

Due to this construction, sine the operating section provided in the optical element and the guide sections are formed by the same process using the same mask, the positional discrepancy between the position sensing section of each of the position sensing metals whose position is adjusted by the corresponding guide section and the operating section provided to the optical element can be reduced.

What is claimed is:

1. An optical module comprising an optical element and a substrate firmly connected to each other, wherein said optical element includes at least one protruding metal mark for positional alignment with said substrate, and said substrate includes an optical member mounting section and at least one recessed etched mark for alignment with said optical element, said recessed etched mark being formed using the same mask used for forming said optical member mounting section and being aligned with the protruding metal mark.

2. An optical module comprising an optical element and a substrate firmly connected to each other, wherein said optical element includes an operating section, an optical-element-side electrode, and at least one guide section for the positional alignment with said substrate, and said substrate includes an optical member mounting section and at least one recessed etched mark for alignment with said optical element, wherein said at least one guide section is formed using the same mask used for forming said operating section, and said at least one recessed etched mark is formed using the same mask used for forming said optical member mounting section.

3. The optical module according to claim 2, wherein said optical element further comprises position sensing metals provided on a lateral end portion of said optical element, each of said position sensing metals having a position sensing section adjusted in position by said guide section.

4. The optical module according to claim 3, wherein said substrate includes a recess for accommodating a substrate-side electrode and solder on said substrate-side electrode, wherein said optical-element-side electrode is in contact with said substrate even when said optical element is disposed at a connecting position of said substrate, and said position sensing metals are abutted against a surface of said substrate including a plurality of said etching marks.

5. The optical module according to claim 2, wherein said substrate includes with a recess for accommodating a substrate-side electrode and solder on said substrate-side electrode, wherein said optical-element-side electrode is in contact with said substrate even when said optical element is disposed at a connecting position of said substrate, and said guide sections are abutted against a surface of said substrate including a plurality of said etching marks.

6. An optical element comprising an operating section and at least one guide section for positional alignment with a substrate to which an optical element is to be firmly connected, wherein said at least one guide section is formed using the same mask as used for forming said operating section.

7. The optical element according to claim 6 further comprising at least one position sensing metal on a lateral end portion of said optical element, each of said position sensing metals having a position sensing section adjusted in position by said guide section.

* * * * *